(12) United States Patent
Yamaguchi

(10) Patent No.: US 10,516,795 B2
(45) Date of Patent: Dec. 24, 2019

(54) POWER SUPPLY APPARATUS HAVING PLURALITY OF PIEZOELECTRIC TRANSFORMERS

(71) Applicant: CANON KABUSHIKI KAISHA, Tokyo (JP)

(72) Inventor: Atsuhiko Yamaguchi, Suntou-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/217,247

(22) Filed: Dec. 12, 2018

(65) Prior Publication Data

US 2019/0199879 A1 Jun. 27, 2019

(30) Foreign Application Priority Data

Dec. 22, 2017 (JP) ................. 2017-246400

(51) Int. Cl.
*H04N 1/00* (2006.01)
*G03G 15/00* (2006.01)
*G03G 15/16* (2006.01)
*H01L 41/04* (2006.01)

(52) U.S. Cl.
CPC ..... *H04N 1/00888* (2013.01); *G03G 15/1615* (2013.01); *G03G 15/80* (2013.01); *H01L 41/044* (2013.01)

(58) Field of Classification Search
CPC .......... H04N 1/00888; G03G 15/1615; G03G 15/80; H01L 41/044
See application file for complete search history.

(56) References Cited

U.S. PATENT DOCUMENTS

| 2003/0222537 | A1* | 12/2003 | Chou | H01L 41/044 |
| | | | | 310/318 |
| 2006/0220495 | A1* | 10/2006 | Yamaguchi | G03G 15/80 |
| | | | | 310/318 |
| 2007/0200455 | A1* | 8/2007 | Yamaguchi | G03G 15/5004 |
| | | | | 310/318 |

FOREIGN PATENT DOCUMENTS

JP 2012050282 A 3/2012

* cited by examiner

*Primary Examiner* — G. M. A Hyder
(74) *Attorney, Agent, or Firm* — Rossi, Kimms & McDowell LLP

(57) ABSTRACT

A first rectification circuit is connected to an output side of a first piezoelectric transformer and outputs a voltage of a first polarity. A second rectification circuit is connected to an output side of the second piezoelectric transformer and outputs a voltage of a second polarity. A frequency adjustment unit is connected between the second rectification circuit and an output of the second piezoelectric transformer, and adjusts a relationship between an output voltage and a drive frequency of the second piezoelectric transformer. A driving circuit supplies a drive signal to both the first piezoelectric transformer and the second piezoelectric transformer.

17 Claims, 11 Drawing Sheets

F I G. 4B

| Se1 | Se2 | DRIVING START FREQUENCY |
|---|---|---|
| 0 | 0 | Fmaxp1: 177KHz |
| 0 | 1 | Fmaxn1: 162KHz |
| 1 | 0 | Fcent: 162.5KHz |
| 1 | 1 | Fmax2: 165KHz |

F I G. 4C

| Ssw | COMPARISON RESULT | TRANSITION DIRECTION |
|---|---|---|
| 0 | Vda > Vdet | REDUCE |
| 0 | Vda < Vdet | INCREASE |
| 1 | Vda > Vdet | INCREASE |
| 1 | Vda < Vdet | REDUCE |

FIG. 5A
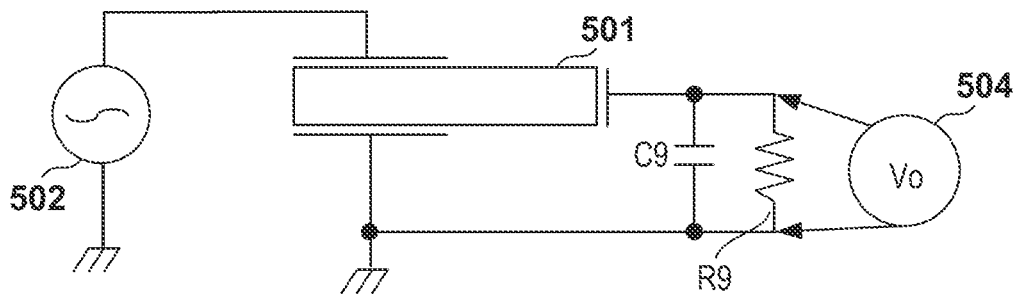
FIG. 5B
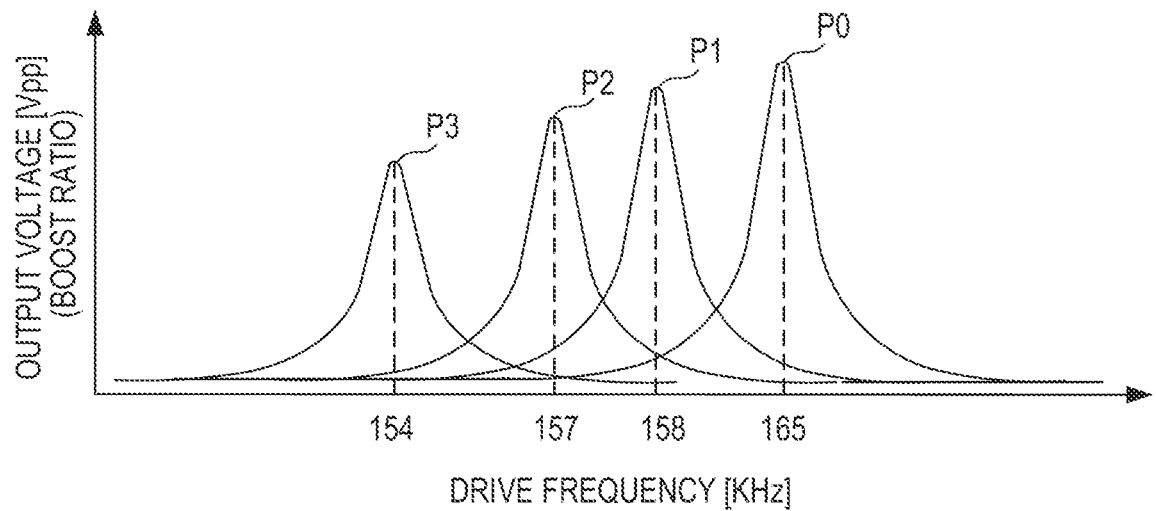
FIG. 5C
| CAPACITANCE [pF] | RESONANCE FREQUENCY [KHz] |
|---|---|
| NONE | 165 |
| 3.3 | 158 |
| 5.0 | 157 |
| 10.0 | 154 |

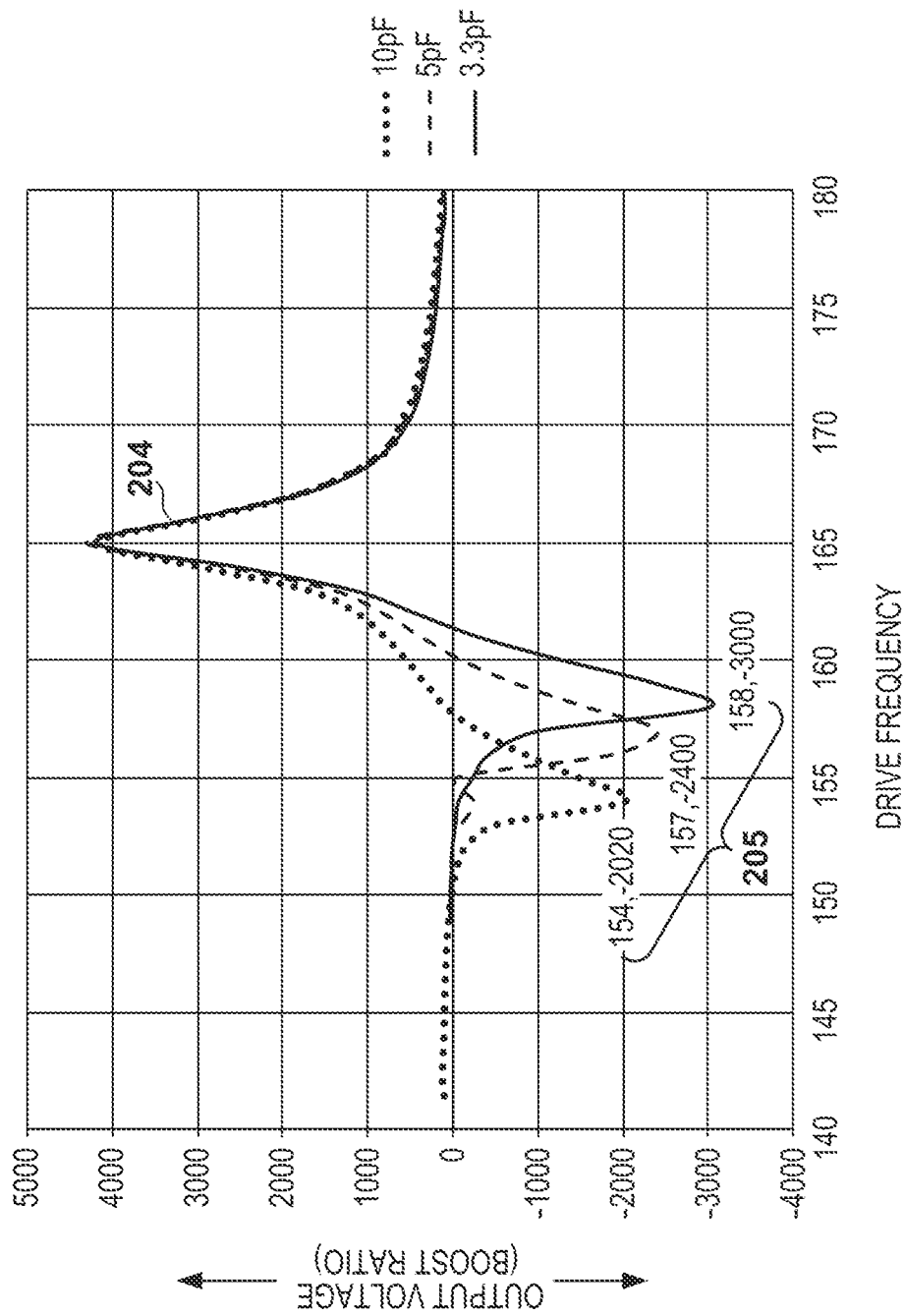

FIG. 7

| Da | Vdet[V] | Vtr[V] |
|----|---------|--------|
| 00 | 0.01 | −1,099 |
| 08 | 0.12 | −958 |
| 10 | 0.22 | −817 |
| 18 | 0.32 | −677 |
| 20 | 0.43 | −536 |
| 28 | 0.53 | −395 |
| 30 | 0.63 | −255 |
| 38 | 0.73 | −114 |
| 40 | 0.84 | 27 |
| 48 | 0.94 | 168 |
| 50 | 1.04 | 308 |
| 58 | 1.15 | 449 |
| 60 | 1.25 | 590 |
| 68 | 1.35 | 731 |
| 70 | 1.46 | 871 |
| 78 | 1.56 | 1,012 |
| 80 | 1.66 | 1,153 |
| 88 | 1.77 | 1,293 |
| 90 | 1.87 | 1,434 |
| 98 | 1.97 | 1,575 |
| A0 | 2.08 | 1,716 |
| A8 | 2.18 | 1,856 |
| B0 | 2.28 | 1,997 |
| B8 | 2.38 | 2,138 |
| C0 | 2.49 | 2,279 |
| C8 | 2.59 | 2,419 |
| D0 | 2.69 | 2,560 |
| D8 | 2.80 | 2,701 |
| E0 | 2.90 | 2,841 |
| E8 | 3.00 | 2,982 |
| F0 | 3.11 | 3,123 |
| F8 | 3.21 | 3,264 |
| FF | 3.30 | 3,387 |

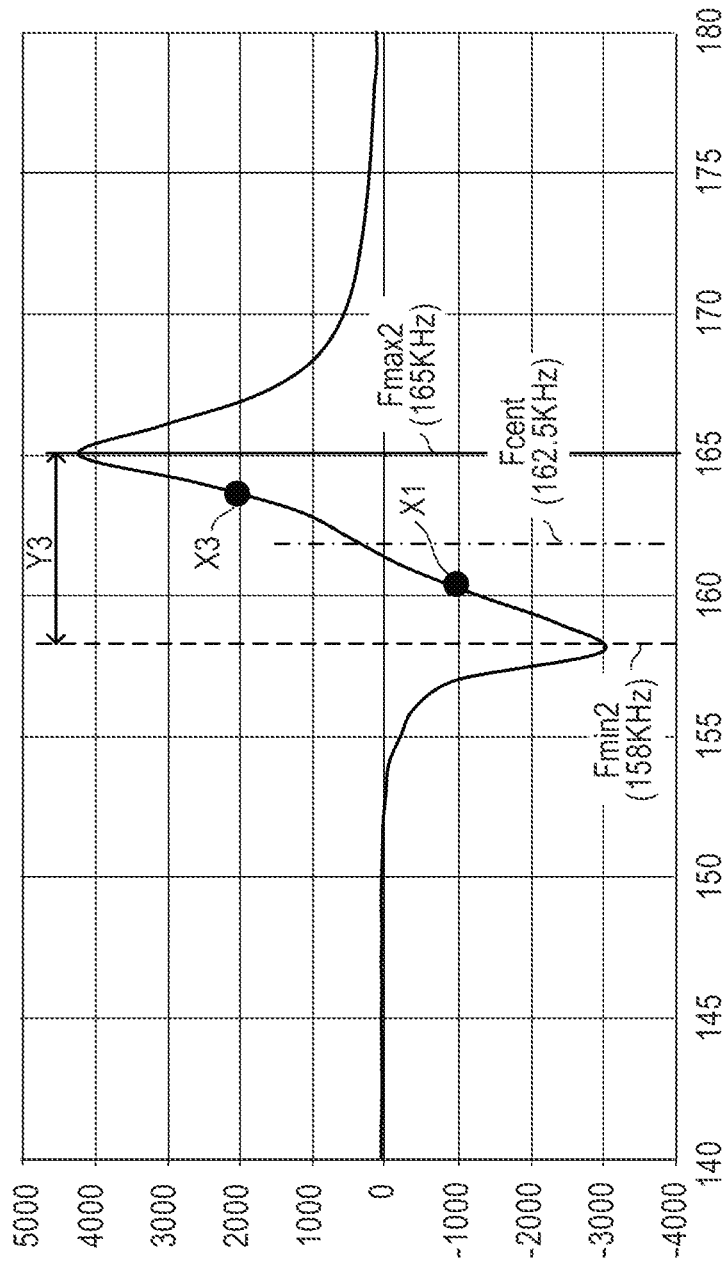

POWER SUPPLY APPARATUS HAVING PLURALITY OF PIEZOELECTRIC TRANSFORMERS

BACKGROUND OF THE INVENTION

Field of the Invention

The present invention relates to a power supply apparatus having a plurality of piezoelectric transformers.

Description of the Related Art

An electrophotographic method image forming apparatus uses various high voltages in an electrophotographic process. The ability to output both of a positive polarity voltage and a negative polarity voltage is commonly required of a power supply apparatus. Consequently, it is easy for the size of an image forming apparatus to increase. In recent years, from the perspective of miniaturization of power supply apparatuses, piezoelectric transformers have been used in place of electromagnetic transformers. According to Japanese Patent Laid-Open No. 2012-50282, there is provided a power supply apparatus that is provided with two driving circuits and two piezoelectric transformers of different sizes in order to be able to output both of a positive polarity voltage and a negative polarity voltage.

However, providing two piezoelectric transformers having different sizes is an obstacle to further miniaturization of a power supply apparatus.

SUMMARY OF THE INVENTION

The present invention provides a power supply apparatus which may comprise the following elements. A first piezoelectric transformer. A first rectification circuit is connected to an output side of the first piezoelectric transformer and is configured to output a voltage of a first polarity. A second piezoelectric transformer. A second rectification circuit is connected to an output side of the second piezoelectric transformer and is configured to output a voltage of a second polarity. A frequency adjustment unit is connected between the second rectification circuit and an output of the second piezoelectric transformer, and is configured to adjust a relationship between an output voltage and a drive frequency of the second piezoelectric transformer. A driving circuit is configured to supply a drive signal to both the first piezoelectric transformer and the second piezoelectric transformer.

Further features of the present invention will become apparent from the following description of exemplary embodiments (with reference to the attached drawings).

BRIEF DESCRIPTION OF THE DRAWINGS

FIGS. 4A to 4C are views for describing a high voltage control unit.

FIGS. 5A to 5C are views for describing relationships among a frequency setting unit, a drive frequency, and an output voltage.

FIG. 6 is a view for describing relationships among a frequency setting unit, a drive frequency, and an output voltage.

FIG. 7 is a view for describing relationships among setting data, detected voltages, and transfer biases.

FIGS. 9A and 9B are views for describing an output characteristic of a power supply apparatus.

DESCRIPTION OF THE EMBODIMENTS

First Embodiment

<Image Forming Apparatus>

Figure 1:
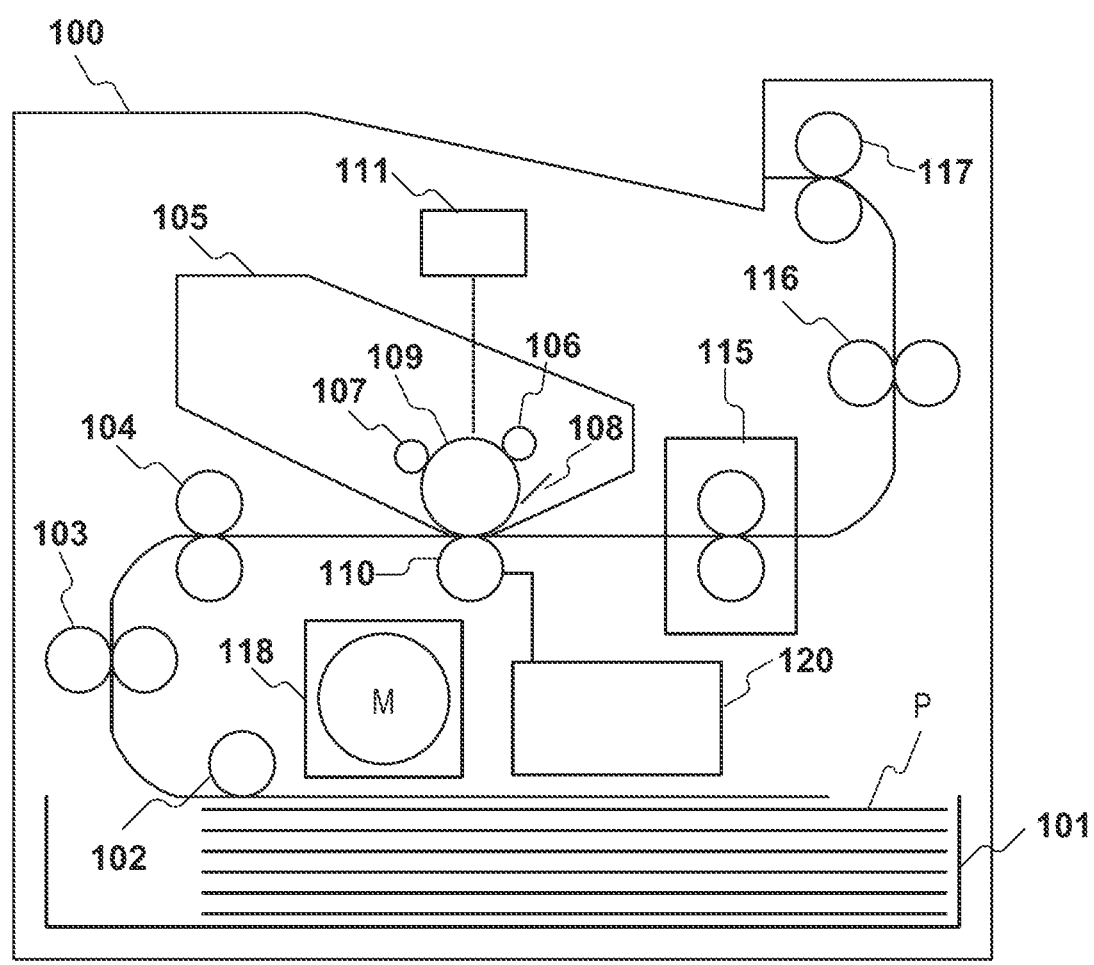
FIG. 1 is an overview cross-sectional view of an image forming apparatus.

FIG. 1 illustrates a configuration of an image forming apparatus 100. A feeding cassette 101 is a container that contains a plurality of sheets P. A pickup roller 102 feeds a sheet P contained in the feeding cassette 101 to a conveyance path. Feeding rollers 103 provided downstream of the pickup roller 102 in the conveyance direction of the sheet P are conveyance rollers for conveying the sheet P further downstream. Registration rollers 104 are conveyance rollers for conveying the sheet P further downstream. The registration rollers 104 adjust a timing when the sheet P reaches a transfer unit, and a timing when a toner image formed by a process cartridge 105 reaches the transfer unit.

The process cartridge 105 has a charger 106, a developer 107, a cleaner 108, and a photosensitive drum 109. The charger 106 uses a charging bias to uniformly charge the surface of the photosensitive drum 109. An exposure device 111 irradiates light in accordance with an image signal onto the surface of the photosensitive drum 109 to form an electrostatic latent image. The developer 107 uses a development bias and toner to develop the electrostatic latent image, and form a toner image. In other words, the toner image is formed by toner adhering to the electrostatic latent image. In this way, the photosensitive drum 109 is an image carrier for carrying an electrostatic latent image or a toner image. A transfer unit 110 uses a transfer bias to transfer the toner image carried on the photosensitive drum 109 to the sheet P. Note that the toner image may be transferred from the photosensitive drum 109 to an intermediate transfer member, and then transferred from the intermediate transfer member to the sheet P. The transfer unit 110 and the photosensitive drum 109 both convey the sheet P downstream while nipping the sheet P. The cleaner 108 cleans toner that remains on the surface of the photosensitive drum 109. A fixing apparatus 115 applies heat and pressure to fix the transferred toner image to the sheet P. Intermediate rollers 116 and discharge rollers 117 further convey the sheet P downstream to discharge the sheet P outside of the image forming apparatus 100.

A motor 118 is a driving source for transferring a driving force to the fixing apparatus 115, conveyance rollers, or the like, to cause the conveyance rollers, roller of the fixing apparatus 115, or the like to rotate. A power supply apparatus 120 generates high voltages such as a charging bias, a development bias, and a transfer bias. As an example, it is assumed here that the power supply apparatus 120 generates positive polarity high voltages and negative polarity high voltages. For example, when a positive polarity high voltage is applied to the transfer unit 110, transfer of a toner image is promoted. In contrast, when a negative polarity high voltage is applied to the transfer unit 110, cleaning of toner by the cleaner 108 is promoted.

<Power Supply Circuit>

Figure 2:
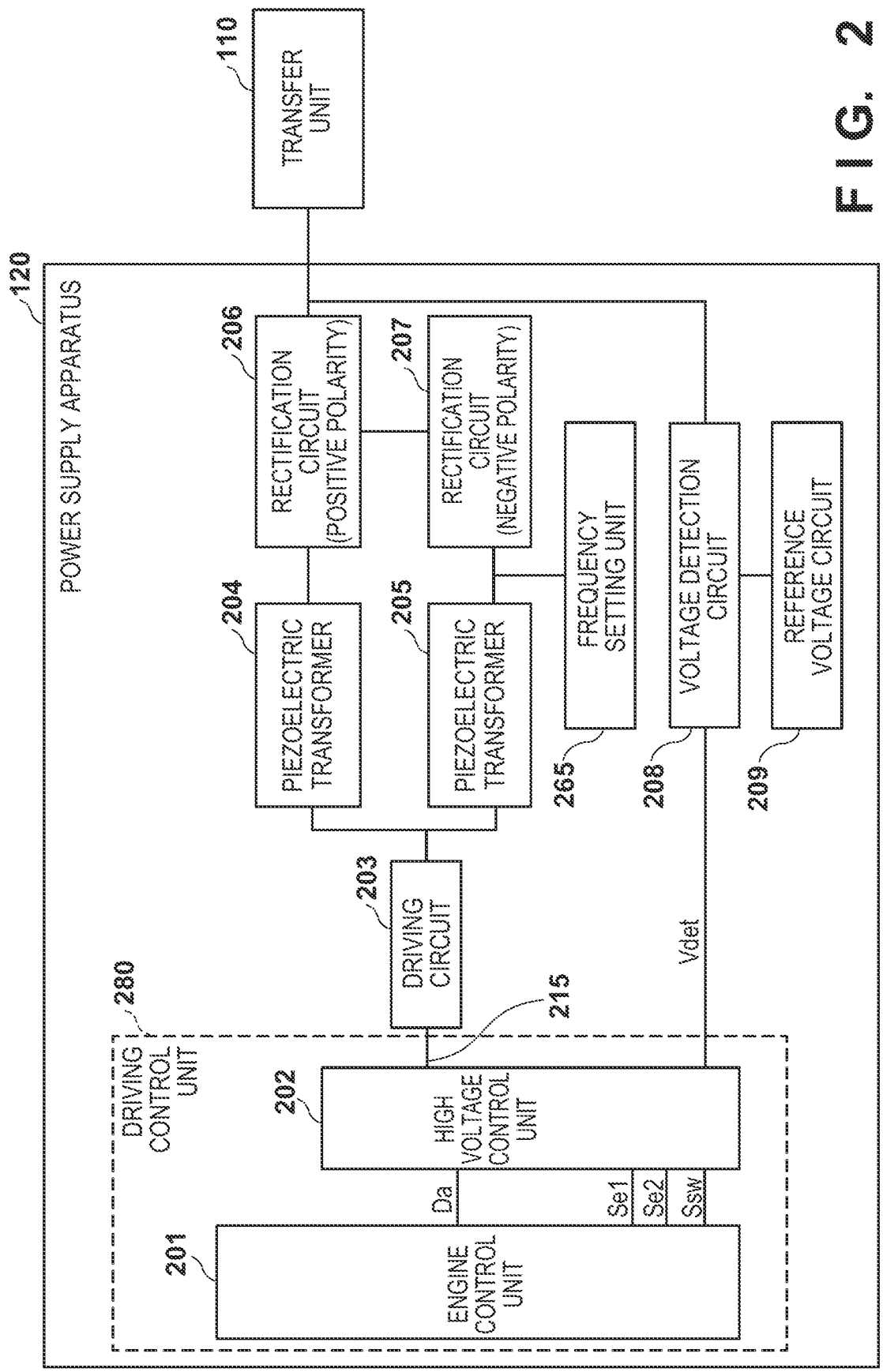
FIG. 2 is a block diagram that illustrates a power supply apparatus.

FIG. 2 illustrates a configuration of the power supply apparatus 120. A driving control unit 280 has an engine control unit 201 and a high voltage control unit 202. The engine control unit 201 executes comprehensive control of the image forming apparatus 100, such as of the motor 118. Description is mainly given below regarding control of the transfer bias applied to the transfer unit 110. The engine control unit 201 outputs setting data Da to the high voltage control unit 202 to thereby set a target voltage Vt for a transfer bias Vtr to be applied to the transfer unit 110. A voltage detection circuit 208 detects the transfer bias Vtr applied to the transfer unit 110 to generate a detected voltage Vdet, and outputs the detected voltage Vdet to the high voltage control unit 202. The engine control unit 201 outputs selection signals Se1 and Se2 and a switching signal Ssw to the high voltage control unit 202. The selection signals Se1 and Se2 are signals for designating starting frequencies (driving start frequencies) for when causing a transition to a drive frequency. Here, as an example, the selection signals Se1 and Se2 each convey one bit of information. The switching signal Ssw is a signal for switching a transition direction (increase or reduce) of a drive frequency. The switching signal Ssw conveys one bit of information.

A driving circuit 203 is a circuit for driving a piezoelectric transformer 204 which is for outputting a positive polarity bias, and a piezoelectric transformer 205 which is for outputting a negative polarity bias. The driving circuit 203 is connected to an input electrode of the piezoelectric transformer 204, and an input electrode of the piezoelectric transformer 205. An output electrode of the piezoelectric transformer 204 is connected to a rectification circuit (positive polarity) 206. The piezoelectric transformer 204 mainly operates in a case of applying a positive polarity bias to the transfer unit 110. The rectification circuit (positive polarity) 206 is a circuit for generating a positive polarity bias by rectifying output of the piezoelectric transformer 204. An output electrode of the piezoelectric transformer 205 is connected to a rectification circuit (negative polarity) 207. The piezoelectric transformer 205 mainly operates in a case of applying a negative polarity bias to the transfer unit 110. The rectification circuit (negative polarity) 207 is a circuit for generating a negative polarity bias by rectifying output of the piezoelectric transformer 205. Note that a frequency setting unit 265 is connected between the piezoelectric transformer 205 and the rectification circuit (negative polarity) 207. The frequency setting unit 265 is a circuit for adjusting an operation frequency of the piezoelectric transformer 205. A reference voltage circuit 209 generates a reference voltage Vs and supplies it to the voltage detection circuit 208.

Figure 3:
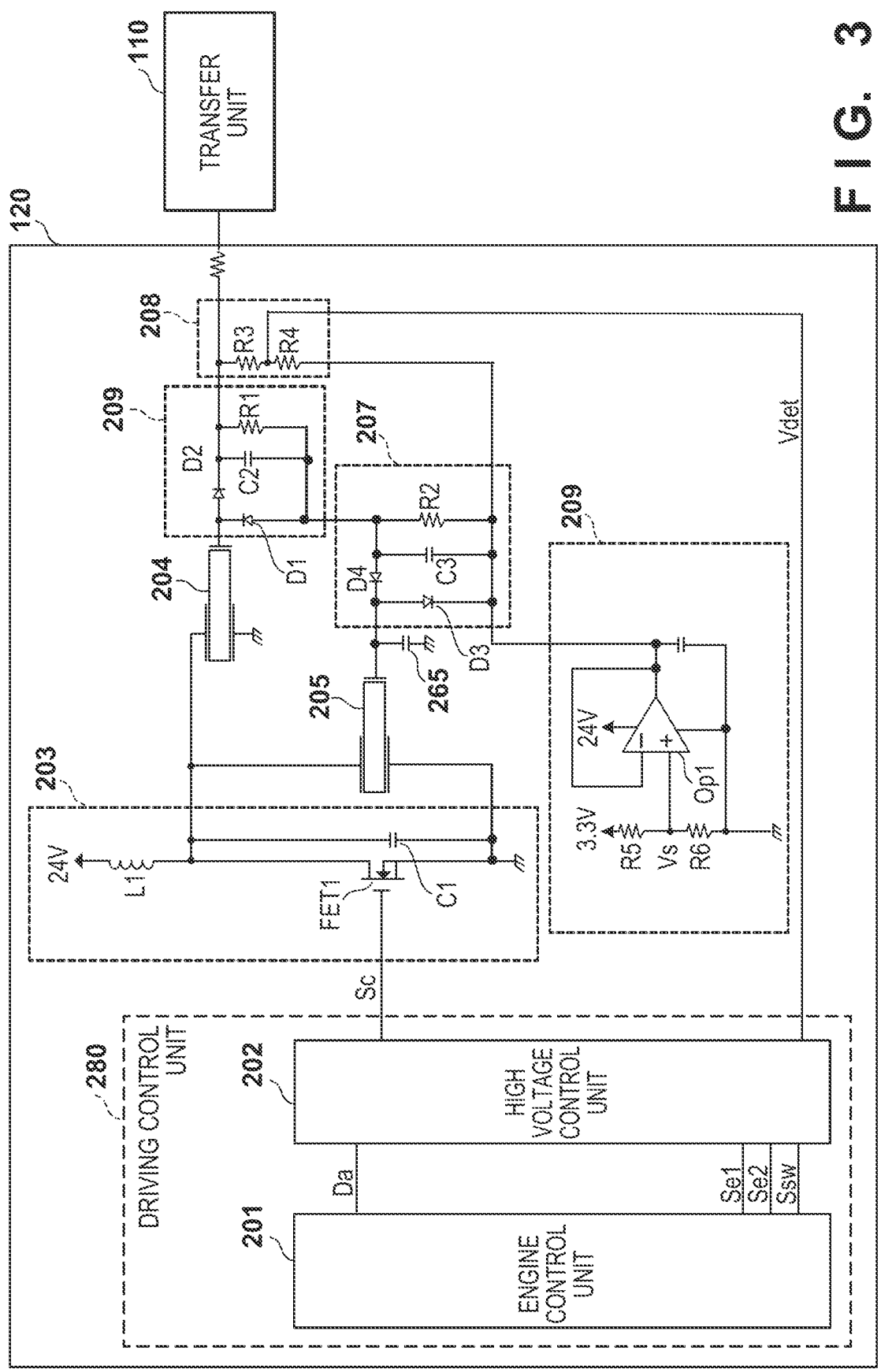
FIG. 3 is a circuit diagram that illustrates the power supply apparatus.

FIG. 3 illustrates a circuit configuration of each unit. The driving circuit 203 is configured by a switching element FET 1, an inductor L1, and a capacitor C1. One end of the inductor L1 is connected to a +24V power supply, and the other end is connected to the capacitor C1 and the drain terminal of the switching element FET 1. The other end of the capacitor C1 is grounded to GND (ground) together with the source terminal of the switching element FET 1. The gate terminal of the switching element FET 1 is connected to an output signal Sc of the high voltage control unit 202. The switching element FET 1 performs a switching operation in response the output signal Sc, and generates a drive signal for driving the piezoelectric transformers 204 and 205. The inductor L1 and the capacitor C1 configure an LC resonance circuit. By this, a switching voltage (for example, an effective voltage of approximately 60 [V]) in accordance with the output signal Sc of the high voltage control unit 202 is generated at a primary side (input electrodes) of the piezoelectric transformers 204 and 205. V indicates volts which is the unit of voltage.

The rectification circuit (positive polarity) 206 is configured by diodes D1 and D2 and a capacitor C2. The rectification circuit (positive polarity) 206 generates a positive polarity direct-current voltage by rectifying and smoothing an alternating current switching voltage outputted from the piezoelectric transformer 204. The rectification circuit (negative polarity) 207 is configured by diodes D3 and D4 and a capacitor C3. The rectification circuit (negative polarity) 207 generates a negative polarity direct-current voltage by rectifying and smoothing an alternating current switching voltage outputted from the piezoelectric transformer 205. Resistors R1 and R2 are resistors for adjusting output voltages. The voltage detection circuit 208 is a voltage-dividing circuit configured by a resistor R3 and a resistor R4. The voltage detection circuit 208 divides the transfer bias applied to the transfer unit 110 to generate the detected voltage Vdet which is proportional to the transfer bias. The reference voltage circuit 209 is configured by resistors R5 and R6 and an operational amplifier Op1. The reference voltage circuit 209 generates the reference voltage Vs. In the present embodiment, the reference voltage Vs is 0.819 [V]. When the transfer bias applied to the transfer unit 110 is 0 [V], the detected voltage Vdet is 0.819 [V] which is the same as the reference voltage Vs. The frequency setting unit 265 may be realized by a frequency adjustment element such as a capacitor, for example.

Figure 4A:
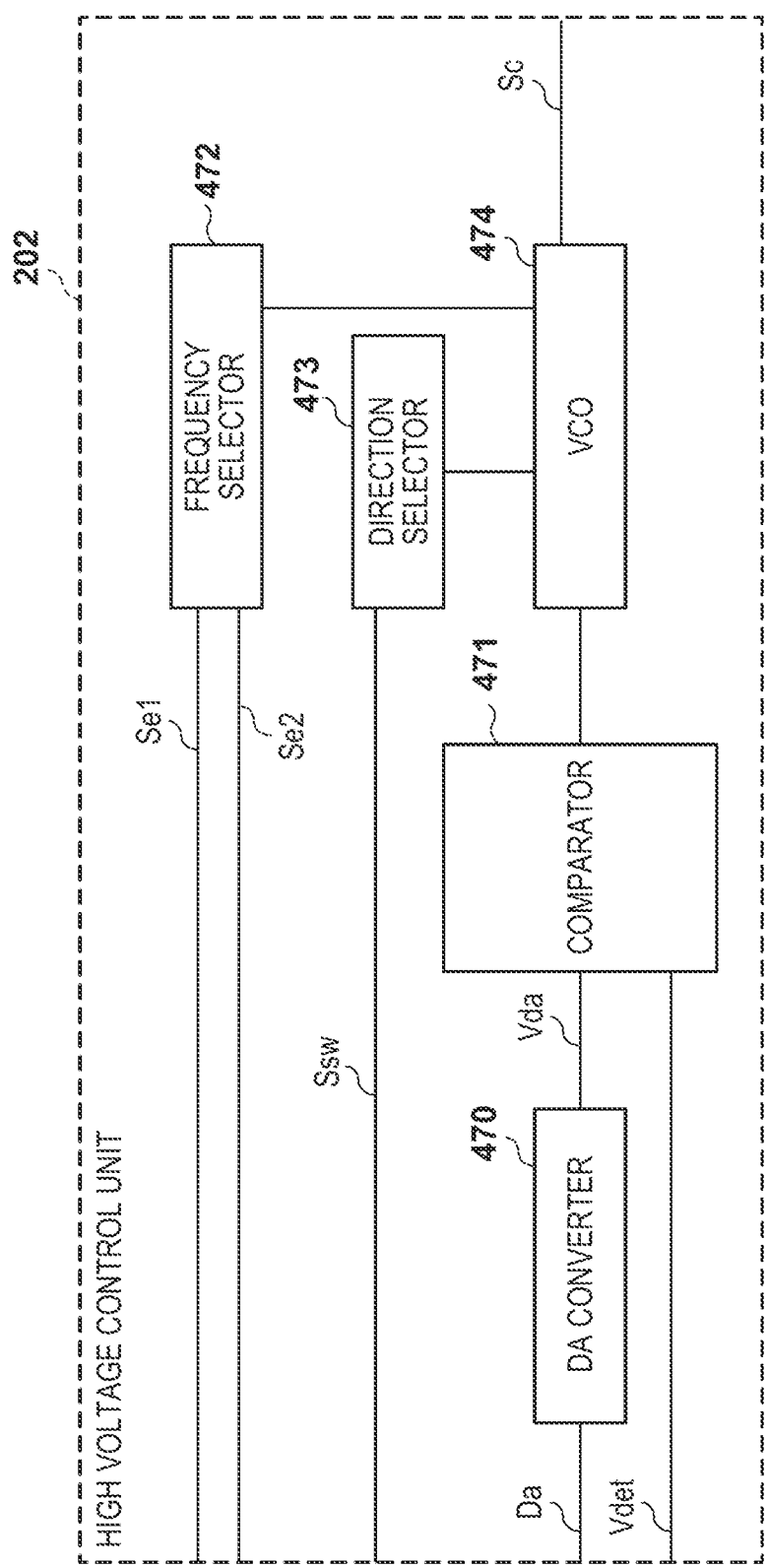

FIG. 4A illustrates a configuration of the high voltage control unit 202. A frequency selector 472 is a selector for deciding a driving start frequency of the piezoelectric transformers 204 and 205 in accordance with the selection signals Se1 and Se2. FIG. 4B is a table that illustrates a relationship between the driving start frequency and combinations of the selection signals Se1 and Se2. When the selection signals Se1 and Se2 are both "0", the driving start frequency of a VCO 474 is set to Fmaxp1 (for example, 177 [KHz]). VCO is an abbreviation for voltage controlled oscillator.

A DA converter 470 generates a target reference voltage Vda based on setting data Da, and supplies the target reference voltage Vda to a comparator 471. The comparator 471 compares the target reference voltage Vda and the detected voltage Vdet, and outputs a comparison result to the VCO 474. The VCO 474 generates a frequency that corresponds with an output voltage of the comparator 471.

A direction selector 473 is a selector for selecting a transition direction for the frequency of the drive signal generated by the VCO 474. The direction selector 473 may select whether to cause the frequency of the VCO 474 to increase or decrease, in accordance with the comparison result of the comparator 471 and the switching signal Ssw. FIG. 4C is a table that illustrates a relationship between the switching signal Ssw, a comparison result of the comparator 471, and a transition direction. As described above, when the selection signals Se1 and Se2 are both "0", the VCO 474 initially generates the output signal Sc of 177 [KHz]. Furthermore, when the switching signal Ssw is "0" and the detected voltage Vdet is less than the target reference voltage Vda, the VCO 474 gradually reduces the frequency of the output signal Sc from 177 [KHz]. In contrast, when the switching signal Ssw is "0" and the detected voltage Vdet exceeds the target reference voltage Vda, the VCO 474 gradually increases the frequency of the output signal Sc. By this, the detected voltage Vdet is maintained at the target reference voltage Vda, and the transfer bias is maintained at the target voltage. Note that a transition direction of the frequency with respect to the comparison result of the comparator 471 when a switching signal Ssw is "1" is opposite to the transition direction of the frequency with respect to the comparison result of the comparator 471 when the switching signal Ssw is "0".

<Measurement Circuit>

FIG. 5A illustrates a measurement circuit. Description is given here for a relationship between an output voltage (the boost ratio) and an operation frequency of the piezoelectric transformer 205 in a case where the capacitance of capacitor C9 of the frequency setting unit 265 has changed. A piezoelectric transformer 501 is a piezoelectric transformer that has the same design specification as the piezoelectric transformers 204 and 205. An AC regulated power supply 502 is a power supply apparatus for generating a drive signal for driving the piezoelectric transformer 501. The AC regulated power supply 502 causes the drive frequency of the drive signal to transition from 200 [KHz] to 130 [KHz]. A voltmeter 504 is a voltmeter for measuring the output voltage (the boost ratio) of the piezoelectric transformer 501. In particular, the voltmeter 504 measures the end-to-end voltage of an output resistor R9 to thereby measure the output voltage (the boost ratio) of the piezoelectric transformer 501. A capacitor C9 is a capacitor provided for frequency adjustment, and functions as the frequency setting unit 265.

FIG. 5B is a graph that illustrates a relationship between a drive frequency and an output voltage. FIG. 5C is a table that illustrates a relationship between the capacitor C9 for frequency adjustment and a resonance frequency f0. The piezoelectric transformer 501 can typically be replaced by an equivalent circuit that includes a primary circuit, a transformer, and a secondary capacitor. Here, the primary circuit is connected to the primary side of the transformer, and the secondary capacitor is connected to the secondary side of the transformer. The primary circuit is an LRC series resonance circuit comprising a primary resistor R, a primary inductor L, and a primary capacitor C. The resonance frequency f0 of the LRC series resonance circuit is $1/(2\pi\sqrt{LC})$. When the capacitor C9 for frequency adjustment is connected to the output electrode of the piezoelectric transformer 501, the capacitance of the capacitor C in the LRC series resonance circuit substantially increases. This is because the capacitor C9 is connected in parallel with the capacitor C. When the capacitance of the capacitor C in the LRC series resonance circuit increases, the resonance frequency f0 decreases, and therefore the operation frequency of the piezoelectric transformer 501 also decreases.

As indicated by FIG. 5C, when the capacitor C9 for frequency adjustment is not connected, the resonance frequency f0 for which the maximum output of the piezoelectric transformer 501 is obtained is 165 [KHz]. FIG. 5B illustrates an output characteristic P0 of the piezoelectric transformer 501 for this case. Typically, the output voltage of the piezoelectric transformer 501 increases in proportion to an increase of the frequency in a frequency range lower than the resonance frequency f0. In contrast, the output voltage of the piezoelectric transformer 501 decreases in proportion to an increase of the frequency in a frequency range higher than the resonance frequency f0. In FIG. 5B, an output characteristic P1 is an output characteristic of the piezoelectric transformer 501 when the capacitor C9 is 3.3 [pF]. The resonance frequency f0 in such a case is 158 [KHz] as illustrated by FIG. 5C. In FIG. 5B, an output characteristic P2 is an output characteristic of the piezoelectric transformer 501 when the capacitor C9 is 5.0 [pF]. The resonance frequency f0 in such a case is 157 [KHz] as illustrated by FIG. 5C. In FIG. 5B, an output characteristic P3 is an output characteristic of the piezoelectric transformer 501 when the capacitor C9 is 10.0 [pF]. The resonance frequency f0 in such a case is 154 [KHz] as illustrated by FIG. 5C. As illustrated by FIG. 5C, the resonance frequency f0 decreases as the capacitance of the capacitor C9 increases, but the output voltage (boost ratio) slightly decreases.

FIG. 6 illustrates output characteristics of the power supply apparatus 120. As described above, the frequency setting unit 265 is connected to the piezoelectric transformer 205 for outputting a negative polarity bias. The frequency setting unit 265 includes the capacitor C9. In FIG. 6, output characteristics for when the capacitance of the capacitor C9 is 3.3 [pF], 5.0 [pF], and 10.0 [pF] are illustrated. As illustrated by FIG. 6, even if the capacitor C9 is connected to the piezoelectric transformer 205, an output characteristic of the piezoelectric transformer 204 for outputting a positive polarity bias is maintained. In other words, it is possible to cause the drive frequency, which induces a maximum output in the piezoelectric transformer 205, to change without affecting the piezoelectric transformer 204. If the capacitance of the capacitor C9 in the frequency setting unit 265 is 3.3 [pF], the resonance frequency f0 of the piezoelectric transformer 205 is 158 [KHz], and the maximum voltage is −3000 [V]. When the capacitance of the capacitor C9 is 5 [pF], the resonance frequency f0 is 157 [KHz], and the maximum voltage is −2400 [V]. When the capacitance of the capacitor C9 is 10 [pF], the resonance frequency f0 is 154 [KHz], and the maximum voltage is −2020 [V].

Figure 8:
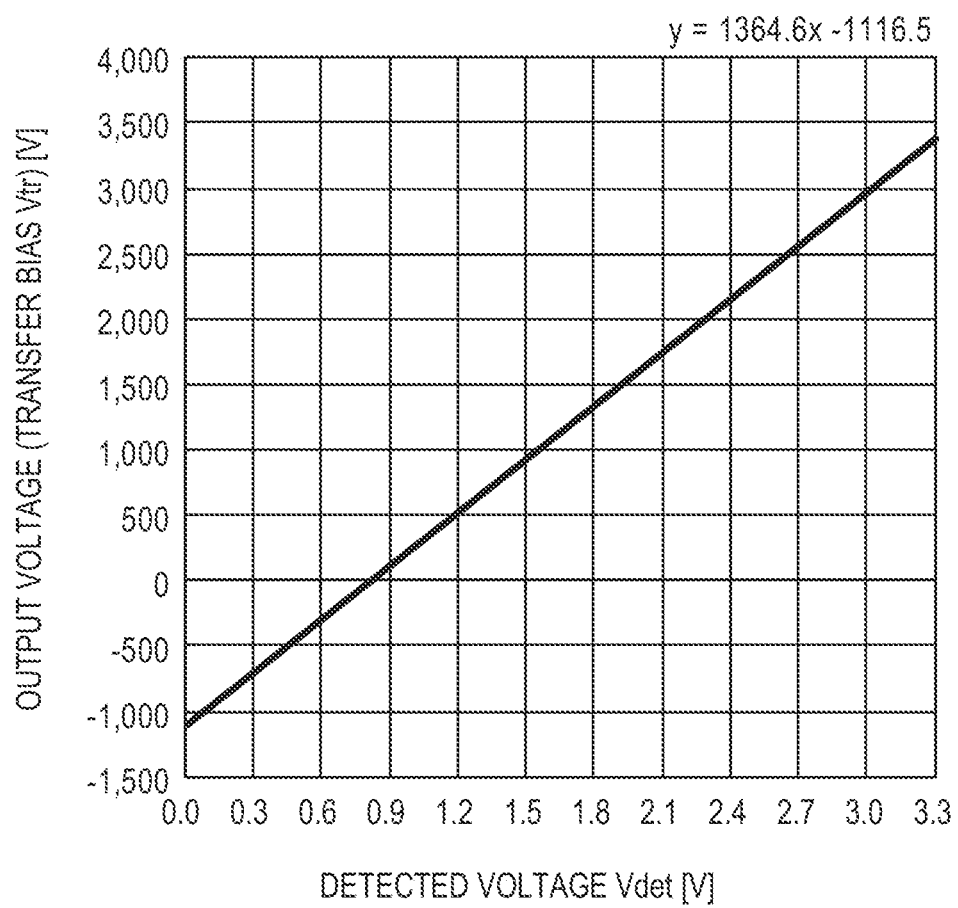
FIG. 8 is a view for describing relationships between detected voltages and transfer biases.

FIG. 7 illustrates a relationship between the setting data Da, the transfer bias Vtr, and the detected voltage Vdet. Here, the transfer bias Vtr indicates the output voltage of the power supply apparatus 120. FIG. 8 is a graph that illustrates a relationship of the detected voltage Vdet with respect to the transfer bias Vtr. From FIG. 7 and FIG. 8 it is understood that the transfer bias Vtr and the detected voltage Vdet are in proportion.

Example of Switching the Transfer Bias from a Positive Polarity Bias to a Negative Polarity Bias Here, a case is assumed where the transfer bias Vtr applied to the transfer unit 110 is first set to +1997 [V], and next the transfer bias Vtr is switched to −1099 [V] which is a cleaning bias. In addition, it is assumed that a drive frequency higher than the resonance frequency f0 (165 [KHz]) of the piezoelectric transformer 204 is used to generate the positive polarity bias. Similarly, it is assumed that a drive frequency higher than the resonance frequency f0 (157.5 [KHz]) of the piezoelectric transformer 205 is used to generate the negative polarity bias.

A lower-limit value of an operation range Y1 of the piezoelectric transformer 204 is a minimum frequency Fmin1 (145 [KHz]). An upper-limit value of the operation range Y1 is a maximum frequency Fmaxp1 (177 [KHz]). A lower-limit value of an operation range Y2 of the piezoelectric transformer 205 is Fmin1 (145 [KHz]). An upper-limit value of the operation range Y2 is Fmaxn1 (162 [KHz]).

(1) Transition from 0 [V] to +1997 [V]

Firstly, in order to output +1997 [V] which is a positive polarity bias to the transfer unit 110, the engine control unit 201 sets each of the selection signals Se1 and Se2 to "0". The engine control unit 201 sets the switching signal Ssw to "0". The frequency selector 472 of the high voltage control unit 202 sets the driving start frequency to Fmaxp1 (177 [KHz]) in accordance with the selection signals Se1 and Se2. The engine control unit 201 sets the setting data Da to "B0h". B0h is data for setting Vda to 2.28 [V]. The DA converter 470 outputs the voltage 2.28 [V] in accordance with the setting data Da. As illustrated by FIG. 7, Vda of 2.28 [V] corresponds to the transfer bias Vtr at +1997 [V]. In this state, the transfer bias Vtr has not yet been applied to the transfer unit 110. In other words, the transfer bias Vtr is 0 [V]. Accordingly, the value of the detected voltage Vdet is 0.819 [V]. Accordingly, Vda>Vdet is satisfied in this state.

Figure 9A:
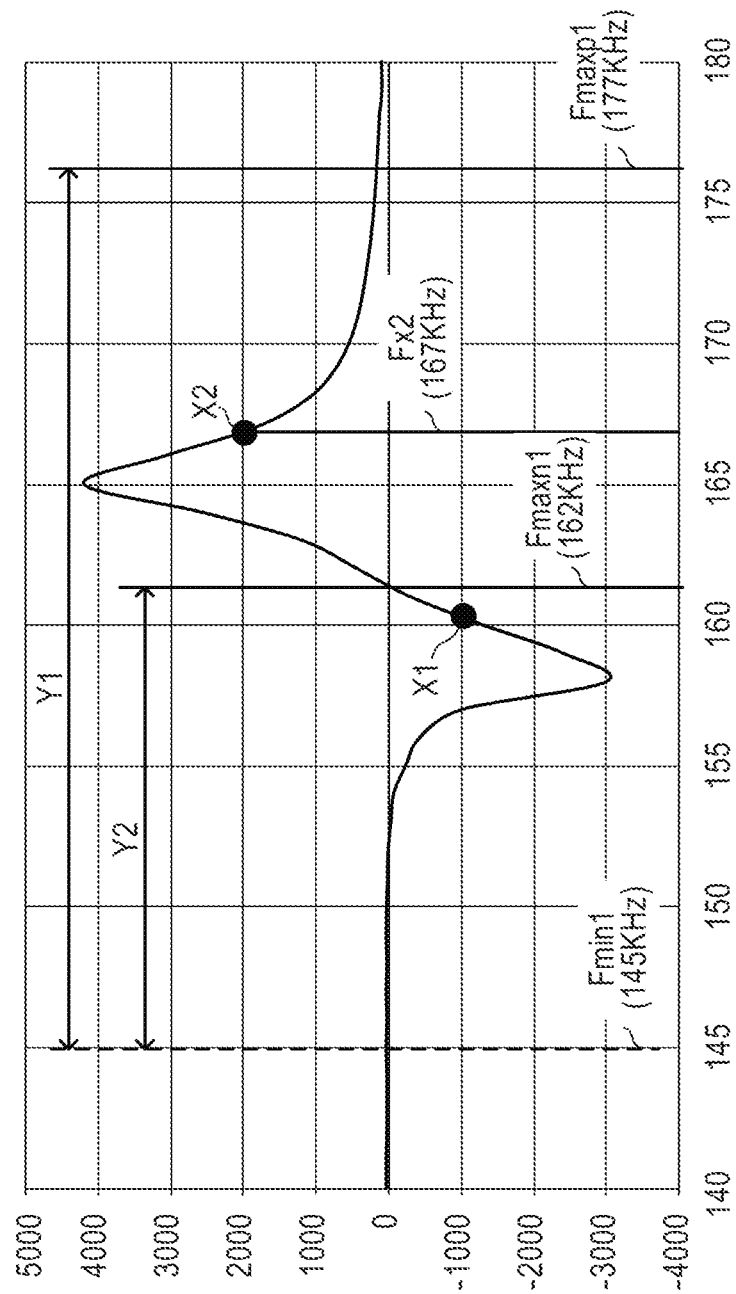

According to FIG. 4C, the VCO 474 must gradually reduce the drive frequency from Fmaxp1 (177 [KHz]) which is the driving start frequency. This is because, in a range where the driving start frequency is higher than the resonance frequency f0, the output voltage increases by the reduction of the drive frequency. Accordingly, the VCO 474 gradually reduces the drive frequency until the detected voltage Vdet matches the target reference voltage Vda. A common drive signal is supplied to the piezoelectric transformer 204 and the piezoelectric transformer 205 from the driving circuit 203. As illustrated by FIG. 9A, the drive frequency of the drive signal gradually decreases from Fmaxp1 (177 [KHz]) to near Fx2 (167 [KHz]).

In this way, at a timing of outputting a positive polarity bias, the piezoelectric transformer 204 dominantly operates. In contrast, because the drive frequency is deviating from the operation range Y2, the output voltage of the piezoelectric transformer 205 becomes small to a level that can be ignored.

When the detected voltage Vdet becomes approximately equal to the target reference voltage Vda, change of the drive frequency of the VCO 474 stops. By this, the transfer bias Vtr which is applied to the transfer unit 110 becomes +1997 [V]. As illustrated by FIG. 9A, coordinates made up of the transfer bias Vtr and the drive frequency at this point is a point X2.

(2) Transition from +1997 [V] to −1099 [V] Through 0 [V]

When transfer of the toner image ends, the transfer bias Vtr is set to the cleaning bias. Here, it is assumed that the cleaning bias is −1099 [V]. In such a case, the transfer bias Vtr must change from +1997 [V] to −1099 [V]. However, when the drive frequency is reduced from the point X2, the transfer bias Vtr temporarily increases. Accordingly, the driving circuit 203 increases the drive frequency, and first reduces the transfer bias Vtr to "0". Subsequently, the driving circuit 203 sets the driving start frequency to Fmaxn1, and gradually reduces the drive frequency from there to thereby adjust the transfer bias Vtr to −1099 [V].

(2-1) Transition from +1997 [V] to 0 [V]

The engine control unit 201 sets the setting data Da to "3Eh" to thereby control the target reference voltage Vda that the DA converter 470 outputs to 0.819 [V]. At this point in time, the selection signals Se1 and Se2 and the switching signal Ssw are not changed. With this, the transfer bias Vtr decreases to 0 [V].

(2-2) Transition from 0 [V] to −1099 [V]

The engine control unit 201 sets the selection signal Se1 to "0" and sets the selection signal Se2 to "1" to thereby set the driving start frequency to Fmaxn1=162 [KHz]. The engine control unit 201 also sets the switching signal Ssw to "1". As illustrated by FIG. 4C, if the detected voltage Vdet is higher than the target reference voltage Vda, the VCO 474 reduces the drive frequency to thereby reduce the transfer bias Vtr. By setting the setting data Da of the engine control unit 201 to "00h", the target reference voltage Vda is set to 0.01 [V]. As illustrated by FIG. 7, these instances of the setting data Da and the target reference voltage Vda correspond to the transfer bias Vtr at −1099 [V].

In such a case, Vda<Vdet is satisfied. Accordingly, as indicated by FIG. 4C, the VCO 474 must gradually reduce the drive frequency from Fmaxn1 (162 [KHz]) which is the driving start frequency. The VCO 474 reduces the drive frequency until the detected voltage Vdet matches the target reference voltage Vda (until the transfer bias Vtr matches −1099 [V] which is the target voltage). As illustrated by FIG. 9A, coordinates made up of the transfer bias Vtr and the drive frequency at this point is a point X1.

In this example, the capacitor C9 which is 5 [pF] is connected as the frequency setting unit 265 to the output electrode of the piezoelectric transformer 205. Accordingly, when the transfer bias Vtr is a negative polarity, the piezoelectric transformer 205 dominantly operates. Note that the output voltage of the piezoelectric transformer 204 becomes small to a level that can be ignored.

(2') Transition from +1997 [V] to −1099 [V] (High-Speed Transition)

To achieve a high-speed transition, the step for transitioning from +1997 [V] to 0 [V] in accordance with the piezoelectric transformer 204 may be omitted.

The engine control unit 201 sets the selection signal Se1 to "0" and sets the selection signal Se2 to "1" to thereby set the driving start frequency to Fmaxn1=162 [KHz]. The engine control unit 201 also sets the switching signal Ssw to "1". As illustrated by FIG. 4C, if the detected voltage Vdet is higher than the target reference voltage Vda, the VCO 474 reduces the drive frequency to thereby reduce the transfer bias Vtr. By setting the setting data Da of the engine control unit 201 to "00h", the target reference voltage Vda is set to 0.01 [V]. As illustrated by FIG. 7, these instances of the setting data Da and the target reference voltage Vda correspond to the transfer bias Vtr at −1099 [V].

In such a case, Vda<Vdet is satisfied. Accordingly, as indicated by FIG. 4C, the VCO 474 must gradually reduce the drive frequency from Fmaxn1 (162 [KHz]) which is the driving start frequency. The VCO 474 reduces the drive frequency until the detected voltage Vdet matches the target reference voltage Vda (until the transfer bias Vtr matches −1099 [V] which is the target voltage). As illustrated by FIG. 9A, coordinates made up of the transfer bias Vtr and the drive frequency at this point is the point X1.

(3) Transition from −1099 [V] to 0 [V]

When cleaning of the toner image completes, the transfer bias Vtr is returned to 0 [V]. In this case, by setting the setting data Da of the engine control unit 201 to "3Eh", the target reference voltage Vda is set to 0.819 [V]. At this point in time, the selection signals Se1 and Se2 and the switching signal Ssw are not changed. In addition, the detected voltage Vdet is 0.01 [V], and Vda>Vdet is satisfied. The VCO 474 increases the drive frequency in accordance with FIG. 4C. By this, the detected voltage Vdet becomes 0.819 [V] and the transfer bias Vtr becomes 0 [V].

By virtue of the first embodiment, by adding the frequency setting unit 265, it is possible to provide the power supply apparatus 120 which can output both of a positive polarity bias and a negative polarity bias using the piezoelectric transformers 204 and 205 which have the same design specification. Because it is possible to have the piezoelectric transformers 204 and 205 be the same model, a decrease in the manufacturing cost of the power supply apparatus 120 due to mass production of the piezoelectric transformers 204 and 205 is achieved. Because the piezoelectric transformers 204 and 205 have the same design specification, it is possible to commonalize the driving circuit 203 for generating the drive signal. This should lead to miniaturization and a decrease in the manufacturing cost of the power supply apparatus 120.

Second Embodiment

In the first embodiment, both of the driving range of the piezoelectric transformer 204 and the driving range of the piezoelectric transformer 205 were driving ranges for which the boost ratio increased by reducing the drive frequency. In the second embodiment, a driving range for which the boost ratio increases without an increase in the drive frequency is employed as the driving range for the piezoelectric transformer 204. Such a driving range is a frequency range lower than the resonance frequency f0 of the piezoelectric transformer 204.

In FIG. 9B, Fmax2 (165 [KHz]) is indicated as the resonance frequency f0 of the piezoelectric transformer 204. An upper-limit value of an operation range Y3 of the piezoelectric transformers 204 and 205 matches the resonance frequency f0 of the piezoelectric transformer 204. The resonance frequency f0 of the piezoelectric transformer 205 to which the capacitor C9 is connected is Fmin2 (158 [KHz]). A lower-limit value of the operation range Y3 of the piezoelectric transformers 204 and 205 is set to Fmin2. Description is given for an example in which, similarly to in the first embodiment, the transfer bias Vtr is caused to transition from 0 [V]→+1997 [V]→0 [V]→−1099 [V].

(1) Transition to 0 [V]

The engine control unit 201 sets the selection signal Se1 to "1" and sets the selection signal Se2 to "O" to thereby set the driving start frequency to Fcent (162.5 [KHz]). Fcent (162.5 [KHz]) is a center frequency that is set as an average value of Fmax2 (165 [KHz]) and Fmin2 (158 [KHz]). By this, the drive frequency is controlled to be within the operation range Y3 indicated in FIG. 9B.

By setting the setting data Da of the engine control unit 201 to "3Eh", the target reference voltage Vda is set to 0.819 [V]. The switching signal Ssw is set to "1". With this, the transfer bias Vtr is controlled to 0 [V]. In the second embodiment, the piezoelectric transformer 205 dominantly operates in a frequency range lower than Fcent (162.5 [KHz]). The piezoelectric transformer 204 dominantly operates in a frequency range greater than Fcent (162.5 [KHz]).

Note that, when the drive frequency is 162.5 [KHz], both of the piezoelectric transformer 204 and the piezoelectric transformer 205 operate. Therefore, the VCO 474 balances the output voltage of the piezoelectric transformer 204 and the output voltage of the piezoelectric transformer 205 so that the detected voltage Vdet becomes 0.819 [V]. With this, the transfer bias Vtr is controlled to 0 [V].

(2) Transition from 0 [V] to +1997 [V]

The engine control unit 201 sets the setting data Da to "B0h" to thereby set the target reference voltage Vda to 2.28 [V]. These instances of the setting data Da and the target reference voltage Vda correspond to the transfer bias Vtr at +1997 [V].

At this point in time, Vda (2.28 [V])>Vdet (0.819 [V]) is satisfied. In addition, the switching signal Ssw stays set to "1". According to FIG. 4C, when such conditions are satisfied, the drive frequency increases. Accordingly, the VCO 474 gradually increases the drive frequency. When the detected voltage Vdet becomes 2.28 [V] which is the target reference voltage Vda, the transfer bias Vtr becomes +1997 [V]. As illustrated by FIG. 9B, a point X3 has coordinates comprising a drive frequency and a boost ratio. At this point, the output voltage of the piezoelectric transformer 205 becomes small to a level that can be ignored.

(3) Transition from +1997 [V] to −1099 [V]

As illustrated by FIG. 9B, by increasing the drive frequency within the operation range Y3, the boost ratio of the piezoelectric transformers 204 and 205 also increases. In addition, by reducing the drive frequency, the boost ratio of the piezoelectric transformers 204 and 205 also decreases. Accordingly, by consecutively reducing the drive frequency, the transfer bias Vtr is switched from a positive polarity bias to a negative polarity bias. In other words, the control method of the second embodiment is simpler than the control method of the first embodiment. More specifically, resetting the selection signals Se1 and Se2 and resetting the switching signal Ssw, which was necessary in the first embodiment, is not necessary in the second embodiment.

By setting the setting data Da of the engine control unit 201 to "00h", the target reference voltage Vda is set to 0.01 [V]. As illustrated by FIG. 7, these control parameters correspond to the transfer bias Vtr at −1099 [V]. By this, the VCO 474 can gradually reduce the drive frequency to thereby reduce the transfer bias Vtr to −1099 [V] which is the target voltage. When the drive frequency becomes lower than Fcent, the piezoelectric transformer 205 dominantly operates, and the output voltage of the piezoelectric transformer 204 becomes small to a level that can be ignored.

(4) Transition from −1099 [V] to 0 [V]

When cleaning completes, the transfer bias Vtr is returned to 0 [V]. As described above, the engine control unit 201 sets the setting data Da to "3Eh". The VCO 474 gradually increases the drive frequency to thereby increase the transfer bias Vtr to 0 [V] which is the target voltage.

In this way, in a case of switching from a positive polarity bias to a negative polarity bias in the second embodiment, there is no necessity for the selection signals Se1 and Se2 and the switching signal Ssw to be changed. Accordingly, for the second embodiment, the control method can be simplified while achieving a similar effect to that of the first embodiment.

SUMMARY

The piezoelectric transformer 204 as illustrated in FIG. 2A or the like is an example of a first piezoelectric transformer. The rectification circuit (positive polarity) 206 is an example of a first rectification circuit that is connected to an output side of the first piezoelectric transformer and is for outputting a voltage of a first polarity. For example, the piezoelectric transformer 205 may be a piezoelectric transformer of the same design specification as that of the first piezoelectric transformer, but it may have a design specification different to that of the first piezoelectric transformer. The rectification circuit (negative polarity) 207 is an example of a second rectification circuit that is connected to an output side of the second piezoelectric transformer and is for outputting a voltage of a second polarity. The frequency setting unit 265 is an example of a frequency adjustment unit that is connected between the second rectification circuit and the output of the second piezoelectric transformer, and adjusts a relationship between an output voltage and a drive frequency of the second piezoelectric transformer. The driving circuit 203 is an example of a driving circuit for supplying a drive signal to each of the first piezoelectric transformer and the second piezoelectric transformer. By virtue of embodiments, because the frequency setting unit 265 is connected to the piezoelectric transformer 205, it is possible to make the operation range of the piezoelectric transformer 204 and the operation range of the piezoelectric transformer 205 differ. In other words, in spite of the fact that the design specification of the piezoelectric transformer 204 is the same as the design specification of the piezoelectric transformer 205, the power supply apparatus 120 can use the single driving circuit 203 to supply a positive polarity bias and a negative polarity bias. Accordingly, it is possible to achieve further miniaturization of the power supply apparatus.

The frequency adjustment unit may be the capacitor C9. By employing such a simple electric circuit element, it is possible to easily adjust, set, or change the operation range of the piezoelectric transformer 204. The capacitor C9 may be a fixed-capacitance capacitor, and may be a variable-capacitance capacitor.

Because the piezoelectric transformers 204 and 205 have the same design specification as one another, the piezoelectric transformers 204 and 205 are designed so that an output voltage becomes a maximum at a first drive frequency. However, by connecting the frequency setting unit 265 to the piezoelectric transformer 205, it is possible to change the drive frequency for which the output voltage is a maximum at the piezoelectric transformer 205 from the first drive frequency to a second drive frequency. This is as illustrated by FIG. 5B and FIG. 5C.

As described using FIG. 9A or the like, the range of the operation frequency of the piezoelectric transformer 204 is at the least from a first frequency (for example, Fmaxn1) to a third frequency (for example, Fmaxp1). At a second frequency higher than the first frequency and lower than the third frequency (for example, 165 [KHz]), the output voltage of the piezoelectric transformer 204 is a maximum. In a range from the first frequency to the second frequency, the output voltage of the piezoelectric transformer 204 increases in response to the increase of the drive frequency. In a range from the second frequency to the third frequency, the output voltage of the piezoelectric transformer 204 decreases in response to the increase of the drive frequency. As described in the first embodiment, when a voltage of the first polarity is set as the target voltage, the driving circuit 203 gradually reduces the drive frequency from the third frequency to thereby control the output voltage from the first rectification circuit to the target voltage.

As described in the second embodiment, when a voltage of the first polarity is set as the target voltage, the driving circuit 203 may gradually increase the drive frequency from a predetermined frequency lower than the second frequency (for example, Fcent). By this, the voltage of the first polarity outputted from the first rectification circuit may be controlled to the target voltage.

As described using FIG. 9A or the like, the range of the operation frequency of the piezoelectric transformer 205 is at the least from a fourth frequency (for example, Fmin1) to a sixth frequency (for example, Fmaxn1). At a fifth frequency higher than the fourth frequency and lower than the sixth frequency, the output voltage of the piezoelectric transformer 205 is a maximum. In a range from the fourth frequency to the fifth frequency, the output voltage of the piezoelectric transformer 205 increases in response to the increase of the drive frequency, and in a range from the fifth frequency to the sixth frequency, the output voltage of the piezoelectric transformer 205 decreases in response to the increase of the drive frequency. When a voltage of the second polarity is set as the target voltage, the driving circuit 203 may gradually reduce the drive frequency from the sixth frequency to thereby control a voltage of the second polarity outputted from the second rectification circuit to the target voltage.

The engine control unit 201 and the high voltage control unit 202 are examples of a setting unit for setting an initial drive frequency (driving start frequency) for a drive signal outputted from the driving circuit 203 in response to a target voltage of the power supply apparatus 120. As indicated by the first embodiment, the engine control unit 201 or the high voltage control unit 202 sets a third frequency (for example, Fmaxp1) to the initial drive frequency when a voltage of the first polarity is set as the target voltage. Furthermore, the engine control unit 201 or the high voltage control unit 202 controls the driving circuit 203 to reduce the drive frequency if the voltage of the first polarity outputted from the first rectification circuit is lower than the target voltage. The engine control unit 201 or the high voltage control unit 202 controls the driving circuit 203 to increase the drive frequency if the voltage of the first polarity outputted from the first rectification circuit is higher than the target voltage.

As indicated by the second embodiment, the engine control unit 201 or the high voltage control unit 202 may set a predetermined frequency (for example, Fcent) to the initial drive frequency when a voltage of the first polarity is set as the target voltage. The engine control unit 201 or the high voltage control unit 202 controls the driving circuit 203 to increase the drive frequency if the voltage of the first polarity outputted from the first rectification circuit is lower than the target voltage. In addition, the engine control unit 201 or the high voltage control unit 202 controls the driving circuit 203 to reduce the drive frequency if the voltage of the first polarity outputted from the first rectification circuit is greater than the target voltage.

The engine control unit 201 or the high voltage control unit 202 sets a sixth frequency (for example, Fmaxn1) to the initial drive frequency when a voltage of the second polarity is set as the target voltage. Furthermore, the engine control unit 201 or the high voltage control unit 202 controls the driving circuit 203 to increase the drive frequency if the voltage of the second polarity outputted from the second rectification circuit is lower than the target voltage. The engine control unit 201 or the high voltage control unit 202 controls the driving circuit 203 to reduce the drive frequency if the voltage of the second polarity outputted from the second rectification circuit is higher than the target voltage.

The driving circuit 203 may cause the output voltage of the power supply apparatus 120 to transition from a voltage of the first polarity to a voltage of the second polarity. In such a case, the driving circuit 203 may gradually increase the drive frequency from a frequency (for example, Fx2) higher than the second frequency (for example, 165 [KHz]) to thereby reduce the output voltage of the power supply apparatus 120 from the voltage of the first polarity to 0 volts. Subsequently, the driving circuit 203 switches the drive frequency to the sixth frequency (for example, Fmaxn1). Furthermore, the driving circuit 203 may gradually reduce the drive frequency from the sixth frequency to cause the output voltage of the power supply apparatus 120 to transition from 0 volts to the voltage of the second polarity.

As indicated by the second embodiment, in a case of causing the output voltage of the power supply apparatus 120 to transition from a voltage of the first polarity to a voltage of the second polarity, the driving circuit 203 may gradually reduce the drive frequency from a frequency lower than the second frequency (for example, 165 [KHz]). With this, the output voltage of the power supply apparatus 120 may transition from a voltage of the first polarity to a voltage of the second polarity.

In the first and second embodiments, the frequency setting unit 265 is attached to the piezoelectric transformer 205. By this, the operation range of the piezoelectric transformer 205 is adjusted lower than the operation range of the piezoelectric transformer 204. However, the frequency setting unit 265 may be attached to the piezoelectric transformer 204. In other words, another frequency adjustment unit that is connected between the output of the piezoelectric transformer 204 and the first rectification circuit and is for adjusting the relationship between the drive frequency and the output voltage of the piezoelectric transformer 204 may be provided. The frequency setting unit 265 may be provided for the piezoelectric transformer 204 without the frequency setting unit 265 being provided for the piezoelectric transformer 205. In such a case, the operation range of the piezoelectric transformer 205 becomes lower than the operation range of the piezoelectric transformer 204. In addition, the resonance frequency f0 of the piezoelectric transformer 204 will become less than the resonance frequency f0) of the piezoelectric transformer 205.

The frequency setting unit 265 may be attached to each of the piezoelectric transformer 204 and the piezoelectric transformer 205. By making the capacitance of the frequency setting unit 265 connected to the piezoelectric transformer 204 different from the capacitance of the frequency setting unit 265 connected to the piezoelectric transformer 205, it is possible to separate the operation range of the piezoelectric transformer 205 and the operation range of the piezoelectric transformer 204. Accordingly, further miniaturization of the power supply apparatus 120 is achieved.

The piezoelectric transformers 204 and 205 are each manufactured based on the same design specification. Accordingly, the size of the piezoelectric transformer 204 is the same as the size of the piezoelectric transformer 205. For example, the first polarity is a positive polarity and the second polarity is a negative polarity. It may be the case that the first polarity is a negative polarity and the second polarity is a positive polarity.

The engine control unit 201 and the direction selector 473 are examples of instructing units for instructing the driving circuit 203 whether to increase or reduce the drive frequency. Out of the output characteristics of the piezoelectric transformers 204 and 205, the relationship between drive frequency and boost ratio changes depending on whether a frequency range lower than the resonance frequency is used or whether a frequency range higher than the resonance frequency is used. Accordingly, the engine control unit 201 sets the switching signal Ssw in accordance with which the frequency range to use, in other words, in accordance with the driving start frequency.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-246400, filed Dec. 22, 2017 which is hereby incorporated by reference herein in its entirety.

What is claimed is:

1. A power supply apparatus comprising:
a first piezoelectric transformer;
a first rectification circuit connected to an output side of the first piezoelectric transformer and configured to output a voltage of a first polarity;
a second piezoelectric transformer;
a second rectification circuit connected to an output side of the second piezoelectric transformer and configured to output a voltage of a second polarity;
a frequency adjustment unit connected between the second rectification circuit and an output of the second piezoelectric transformer, and configured to adjust a relationship between an output voltage and a drive frequency of the second piezoelectric transformer; and
a driving circuit configured to supply a drive signal to both the first piezoelectric transformer and the second piezoelectric transformer.

2. The power supply apparatus according to claim 1, wherein the frequency adjustment unit is a capacitor.

3. The power supply apparatus according to claim 1, wherein the first piezoelectric transformer and the second piezoelectric transformer are designed so that respective output voltages are maximal at a first drive frequency, and
the frequency adjustment unit changes the drive frequency for which the output voltage at the second piezoelectric transformer is maximal from the first drive frequency to the second drive frequency.

4. The power supply apparatus according to claim 1, wherein an operation frequency range of the first piezoelectric transformer is at least from a first frequency to a third frequency,
an output voltage of the first piezoelectric transformer is maximal at a second frequency greater than the first frequency and less than the third frequency,
the output voltage of the first piezoelectric transformer increases in accordance with an increase of the drive frequency in a range from the first frequency to the second frequency,
the output voltage of the first piezoelectric transformer decreases in accordance with an increase of the drive frequency in a range from the second frequency to the third frequency, if a voltage of the first polarity is set as a target voltage, the driving circuit gradually reduces the drive frequency from the third frequency to thereby control the output voltage from the first rectification circuit to the target voltage.

5. The power supply apparatus according to claim 4, further comprising:
a setting unit configured to set an initial drive frequency of the drive signal outputted from the driving circuit in accordance with a target voltage of the power supply apparatus,
wherein, if a voltage of the first polarity is set as the target voltage, the setting unit sets the initial drive frequency to the third frequency, and controls the driving circuit to reduce the drive frequency if the voltage of the first polarity outputted from the first rectification circuit is less than the target voltage, and increase the drive frequency if the voltage of the first polarity outputted from the first rectification circuit is greater than the target voltage.

6. The power supply apparatus according to claim 1, wherein an operation frequency range of the first piezoelectric transformer is at least from a first frequency to a third frequency,
an output voltage of the first piezoelectric transformer is maximal at a second frequency greater than the first frequency and less than the third frequency,
the output voltage of the first piezoelectric transformer increases in accordance with an increase of the drive frequency in a range from the first frequency to the second frequency,
the output voltage of the first piezoelectric transformer decreases in accordance with an increase of the drive frequency in a range from the second frequency to the third frequency,
if a voltage of the first polarity is set as a target voltage, the driving circuit gradually increases the drive frequency from a predetermined frequency lower than the second frequency to thereby control the voltage of the first polarity outputted from the first rectification circuit to the target voltage.

7. The power supply apparatus according to claim 6, further comprising:
a setting unit configured to set an initial drive frequency of the drive signal outputted from the driving circuit in accordance with a target voltage of the power supply apparatus,
wherein, if a voltage of the first polarity is set as the target voltage, the setting unit sets the initial drive frequency to the predetermined frequency, and controls the driving circuit to increase the drive frequency if the voltage of the first polarity outputted from the first rectification circuit is less than the target voltage, and reduce the drive frequency if the voltage of the first polarity outputted from the first rectification circuit is greater than the target voltage.

8. The power supply apparatus according to claim 1, wherein an operation frequency range of the second piezoelectric transformer is at least from a fourth frequency to a sixth frequency,
an output voltage of the second piezoelectric transformer is maximal at a fifth frequency greater than the fourth frequency and less than the sixth frequency,
the output voltage of the second piezoelectric transformer increases in accordance with an increase of the drive frequency in a range from the fourth frequency to the fifth frequency,
the output voltage of the second piezoelectric transformer decreases in accordance with an increase of the drive frequency in a range from the fifth frequency to the sixth frequency, and
if a voltage of the second polarity is set as a target voltage, the driving circuit gradually reduces the drive frequency from the sixth frequency to thereby control the voltage of the second polarity outputted from the second rectification circuit to the target voltage.

9. The power supply apparatus according to claim 8, further comprising:
a setting unit configured to set an initial drive frequency of the drive signal outputted from the driving circuit in accordance with a target voltage of the power supply apparatus,
wherein, if a voltage of the second polarity is set as the target voltage, the setting unit sets the initial drive frequency to the sixth frequency, and controls the driving circuit to increase the drive frequency if the voltage of the second polarity outputted from the second rectification circuit is less than the target voltage, and reduce the drive frequency if the voltage of the second polarity outputted from the second rectification circuit is greater than the target voltage.

10. The power supply apparatus according to claim 1, wherein an operation frequency range of the first piezoelectric transformer is at least from a first frequency to a third frequency,
an output voltage of the first piezoelectric transformer is maximal at a second frequency greater than the first frequency and less than the third frequency,
the output voltage of the first piezoelectric transformer increases in accordance with an increase of the drive frequency in a range from the first frequency to the second frequency,
the output voltage of the first piezoelectric transformer decreases in accordance with an increase of the drive frequency in a range from the second frequency to the third frequency,
wherein an operation frequency range of the second piezoelectric transformer is at least from a fourth frequency to a sixth frequency,
an output voltage of the second piezoelectric transformer is maximal at a fifth frequency greater than the fourth frequency and less than the sixth frequency,
the output voltage of the second piezoelectric transformer increases in accordance with an increase of the drive frequency in a range from the fourth frequency to the fifth frequency,
the output voltage of the second piezoelectric transformer decreases in accordance with an increase of the drive frequency in a range from the fifth frequency to the sixth frequency, and
wherein, in a case of causing the output voltage of the power supply apparatus to transition from a voltage of the first polarity to a voltage of the second polarity, the driving circuit sets an initial drive frequency of the drive signal to the sixth frequency and gradually reduces the drive frequency from the sixth frequency to thereby cause the output voltage of the power supply apparatus to transition to the voltage of the second polarity.

11. The power supply apparatus according to claim 1, wherein an operation frequency range of the first piezoelectric transformer is at least from a first frequency to a third frequency, an output voltage of the first piezoelectric transformer is maximal at a second frequency greater than the first frequency and less than the third frequency, the output voltage of the first piezoelectric transformer increases in accordance with an increase of the drive frequency in a range from the first frequency to the second frequency, the output voltage of the first piezoelectric transformer decreases in accordance with an increase of the drive frequency in a range from the second frequency to the third frequency, wherein an operation frequency range of the second piezoelectric transformer is at least from a fourth frequency to a sixth frequency, an output voltage of the second piezoelectric transformer is maximal at a fifth frequency greater than the fourth frequency and less than the sixth frequency, the output voltage of the second piezoelectric transformer increases in accordance with an increase of the drive frequency in a range from the fourth frequency to the fifth frequency, the output voltage of the second piezoelectric transformer decreases in accordance with an increase of the drive frequency in a range from the fifth frequency to the sixth frequency, and in a case of causing the output voltage of the power supply apparatus to transition from a voltage of the first polarity to a voltage of the second polarity, the driving circuit gradually reduces the drive frequency from a frequency lower than the second frequency to thereby cause the output voltage of the power supply apparatus to transition from the voltage of the first polarity to the voltage of the second polarity.

12. The power supply apparatus according to claim 1, further comprising:

another frequency adjustment unit connected between the first rectification circuit and an output of the first piezoelectric transformer, and configured to adjust a relationship between an output voltage and a drive frequency of the first piezoelectric transformer.

13. The power supply apparatus according to claim 1, wherein a size of the first piezoelectric transformer is the same as a size of the second piezoelectric transformer.

14. The power supply apparatus according to claim 1, wherein the first polarity is a positive polarity and the second polarity is a negative polarity.

15. The power supply apparatus according to claim 1, further comprising:

an instructing unit configured to instruct the driving circuit whether to increase or reduce the drive frequency.

16. The power supply apparatus according to claim 1, wherein the first piezoelectric transformer and the second piezoelectric transformer are piezoelectric transformers of the same design specification.

17. An image forming apparatus comprising:

an image carrier;

a charging unit configured to uniformly charge the image carrier based on a charging bias;

an irradiation unit configured to form an electrostatic latent image by irradiating light onto the image carrier;

a development unit configured to form a toner image by causing toner to adhere to the electrostatic latent image based on a development bias;

a transfer unit configured to transfer the toner image to a sheet or an intermediate transfer member based on a transfer bias; and a power supply apparatus configured to generate any one of the charging bias, the development bias, and the transfer bias, wherein the power supply apparatus further comprises:

a first piezoelectric transformer;

a first rectification circuit connected to an output side of the first piezoelectric transformer and configured to output a voltage of a first polarity;

a second piezoelectric transformer;

a second rectification circuit connected to an output side of the second piezoelectric transformer and configured to output a voltage of a second polarity;

a frequency adjustment unit connected between the second rectification circuit and an output of the second piezoelectric transformer, and configured to adjust a relationship between an output voltage and a drive frequency of the second piezoelectric transformer; and a driving circuit configured to supply a drive signal to both the first piezoelectric transformer and the second piezoelectric transformer.

* * * * *